US010848113B2

(12) United States Patent
Nguyen

(10) Patent No.: US 10,848,113 B2
(45) Date of Patent: Nov. 24, 2020

(54) HIGH PERFORMANCE FOLDED CASCODE CURRENT SOURCE WITH DUAL MIRRORS CURRENT FEEDBACK

(71) Applicant: Lim Nguyen, Papillion, NE (US)

(72) Inventor: Lim Nguyen, Papillion, NE (US)

( * ) Notice: Subject to any disclaimer, the term of this patent is extended or adjusted under 35 U.S.C. 154(b) by 0 days.

(21) Appl. No.: 16/158,620

(22) Filed: Oct. 12, 2018

(65) Prior Publication Data
US 2019/0115884 A1    Apr. 18, 2019

Related U.S. Application Data

(60) Provisional application No. 62/571,848, filed on Oct. 13, 2017.

(51) Int. Cl.
*H03F 3/45* (2006.01)
*H03F 1/22* (2006.01)
*G05F 3/26* (2006.01)

(52) U.S. Cl.
CPC ........... *H03F 3/45174* (2013.01); *G05F 3/26* (2013.01); *H03F 1/223* (2013.01); *H03F 3/45121* (2013.01); *H03F 3/45219* (2013.01); *H03F 3/45273* (2013.01); *H03F 2203/45* (2013.01)

(58) Field of Classification Search
CPC ........................................................ H03F 3/45
USPC ................................. 330/288; 323/315, 316
See application file for complete search history.

(56) References Cited

U.S. PATENT DOCUMENTS

| 4,866,399 A * | 9/1989 | Gose ...................... G05F 1/467 |
| | | 330/288 |
| 7,863,985 B1 * | 1/2011 | Corsi ........................ H03F 1/14 |
| | | 330/288 |
| 8,237,502 B2 * | 8/2012 | Yuasa ..................... H03F 1/086 |
| | | 330/259 |
| 8,723,603 B2 * | 5/2014 | Bowers ................. H03F 3/3432 |
| | | 330/260 |
| 2007/0229166 A1 * | 10/2007 | Shor ....................... G05F 3/262 |
| | | 330/288 |

* cited by examiner

*Primary Examiner* — Henry Choe

(57) ABSTRACT

Systems and methods for providing a high performance current source are described. In an example implementation, the current source includes transistors in dual current mirror configuration. The dual mirror configuration employs current feedback to increase the output resistance of the current source while achieving a wide voltage swing.

9 Claims, 12 Drawing Sheets

HIGH PERFORMANCE FOLDED CASCODE CURRENT SOURCE WITH DUAL MIRRORS CURRENT FEEDBACK

FIELD OF THE INVENTION

The present invention relates to the field of electronic current sources/sinks that in particular employ current mirrors to achieve very high output resistance and wide voltage swing.

BACKGROUND OF THE INVENTION

Transistor current sources/sinks and mirrors are essential building blocks for analog integrated circuits including operational amplifiers and current conveyors. In prior art the basic bipolar junction transistors (BJTs) current source consists of a diode-connected reference transistor and a matched output transistor with circuit connections at the bases and the emitters so that the output collector current would ideally mirror the reference collector current. The output resistance of the basic current source is equal to the Early's effect resistance: $R_{out}=r_o$ and its output voltage swing is $V_{MIN}=V_{CE,sat}=0.2V$. Cascade and Wilson current sources improve the output resistance, with $R_{out}=\beta r_o/2$ but the output voltage swing is limited by $V_{MIN}=V_{BE}+V_{CE,sat}=0.9V$. Gain-boost and regulated cascode current sources also have improved output resistance via negative feedback. It is desirable for the current sources to have even higher output resistance and lower output voltage swing, as they would improve the performance of integrated circuits employing the current sources for bias and amplifier operations. Designs that enable their trade-offs is therefore preferred, while at the same time requiring low input voltage and providing wide bandwidth output.

BRIEF SUMMARY OF THE INVENTION

Systems and methods for providing a high performance current source are described. In an example embodiment, the current source includes BJTs in a folded cascode and dual current mirrors configuration. The dual current mirrors employ current feedback to increase the output resistance of the current source while achieving a wide voltage swing. The current source embodiments are disclosed and shown to also achieve low input voltage and wide output bandwidth.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The Detailed Description is described with reference to the accompanying figures. The use of the same reference numbers in different instances in the description and the figures may indicate similar or identical items.

DETAILED DESCRIPTION OF THE INVENTION

A high performance BJT current source in a folded cascode configuration was conceived to achieve high output resistance, wide voltage swing and wide-band frequency response with low input voltage. The novel current source employs dual pnp-npn current mirrors for current feedback between the base and the emitter in order to maintain the constant collector current. Simulation results show that the performance of the folded cascode current source is superior to the conventional current sources, achieving impedance bandwidth product in the order of 2.8 TΩ-Hz at 1.6V input voltage. The scheme can be implemented with metal oxide semiconductor field effect transistors (MOSFETs) and provide an efficient design in current feedback amplifiers.

The present invention is a novel BJT current source in a folded cascode configuration that achieves high $R_{out}$ and low $V_{MIN}$. The current source employs dual pnp-npn mirrors pair for current feedback. The design would trade off between $V_{MIN}$ and $R_{out}$ in order to achieve a very high output resistance that exceeds the limit imposed by the collector-base resistance.

Figure 1:
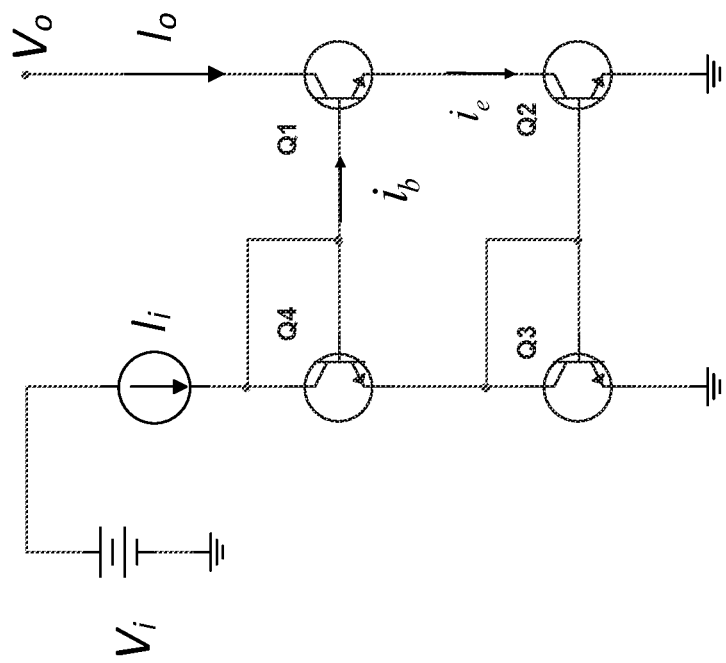
FIG. 1 is an electrical circuit diagram illustration of a cascode current source according to the prior art.

Refer to FIG. 1 illustrating an electrical schematic of the BJT cascode current source according to the prior art comprising four BJTs Q1, Q2, Q3 and Q4.

Figure 2:
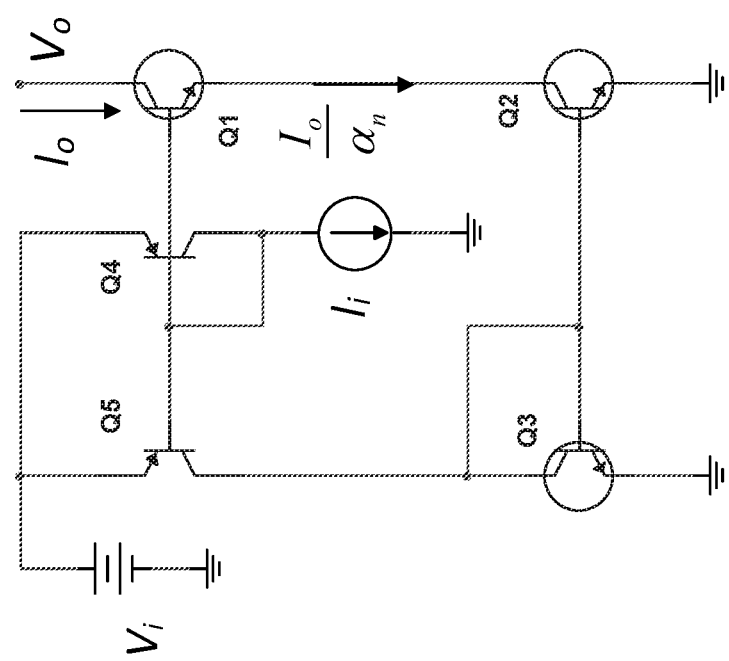
FIG. 2 is an electrical circuit diagram illustration of a folded cascode current source in accordance with an example implementation of the present disclosure.

Refer to FIG. 2 illustrating an electrical schematic of the folded cascode configuration of the present disclosure comprising five BJTs Q1, Q2, Q3, Q4 and Q5.

Comparing FIGS. 1 and 2, it can be appreciated that the diode-connected Q4 in FIG. 1 has replaced by the folded current mirror formed by the pnp transistors pair Q4 and Q5 in FIG. 2.

It can be appreciated from FIG. 2 that the dual current mirrors formed by the pnp transistors pair Q4 and Q5 and the npn transistors pair Q2 and Q3 provide the current feedback that maintains the constant output current at the collector of the output BJT Q1.

Referring to FIG. 2, it can be appreciated that the output current of the folded cascode is given as:

$$I_o = \frac{\alpha_n I_i}{\left(1 + \frac{2}{\beta_n}\right)\left(1 + \frac{2}{\beta_p}\right) - \frac{1}{\beta_n + 1}} \approx \frac{I_i}{1 + \frac{1}{\beta_n} + \frac{2}{\beta_p}}$$

It can be appreciated by inspection that $V_{i,MIN} = 2V_{BE} + V_{CE,sat} = 1.6V$, and the output voltage swing could be as low as $V_{MIN} = 2V_{CE,sat} = 0.4V$.

Figure 3:
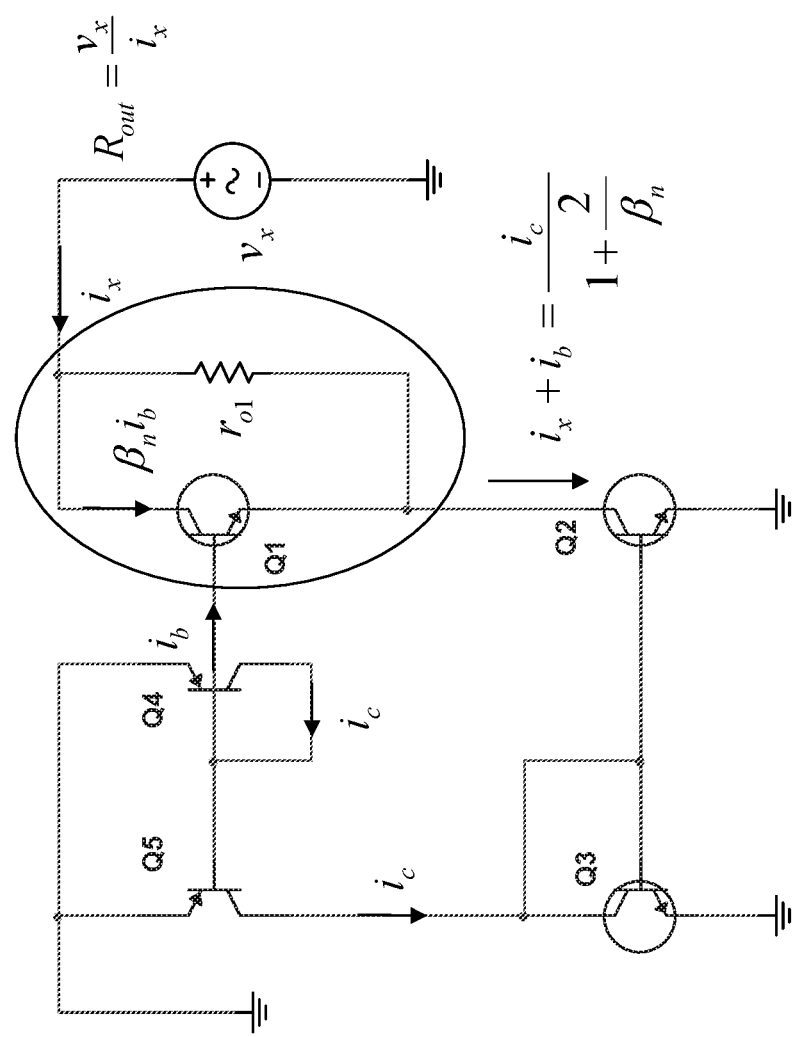
FIG. 3 is an electrical circuit diagram illustration of a folded cascode current source for small-signal analysis according to an example implementation of the present disclosure.

Referring to FIG. 3 that illustrates an electrical schematic the folded cascode current source for small-signal analysis. The small-circuit schematic in FIG. 3 explicitly includes the Early's effect resistance $r_{o1}$ of Q1 and is suitable for analyzing the incremental output resistance $R_{out}$. The output resistance can then be obtained as:

$$R_{out} = \frac{v_x}{i_x} = \left[1 + \frac{1}{2}\beta_n(\beta_n \| \beta_p)\right] r_{o1} + \left[1 - \frac{1}{2}(\beta_n \| \beta_p)\right] r_{o2}$$

$$R_{out} \approx (\beta_n \| \beta_p)(\beta_n - 1)\frac{r_o}{2} \approx (\beta_n \| \beta_p)\frac{\beta_n r_o}{2}$$

where the Early's effect resistances of Q1 and Q2 were taken to be the same $r_{o1} = r_{o2} = r_o$.

Thus, the output resistance of the folded cascode current source is greater than that of the cascode or Wilson source by a factor of $\beta_n \| \beta_p$. A simplified expression is obtained by taken $\beta_n = \beta_p = \beta$, thus achieving an improvement for the output resistance by a factor of $\beta/2$:

$$R_{out} = \left(\frac{\beta}{2}\right)^2 r_o$$

Figure 4:
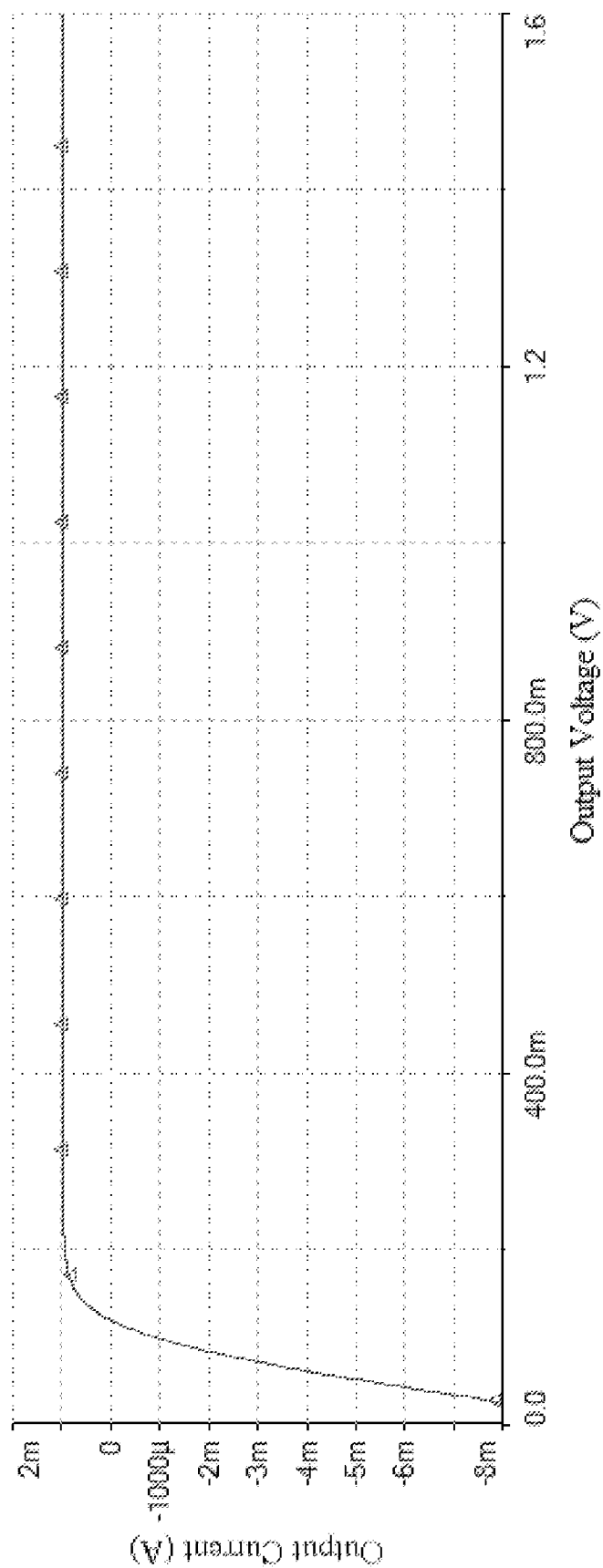
FIG. 4 is a graph illustrating the output current versus voltage (I-V) characteristics of a folded cascode current source in accordance with example implementations of the present disclosure.

The folded cascode current source has been simulated in Multisim using the 2N3904 and 2N3906 BJTs. FIG. 4 graphs the output I-V characteristics of $I_o$ versus $V_o$ for $V_i = 1.6V$ and $I_i = 1$ mA. The plot shows the constant output current of about 1 mA was maintained until $V_o$ drops below=0.2V, $V_{MIN} = V_{CE,sat}$, instead of the expected $2V_{CE,sat} = 0.4V$. This wide voltage swing characteristics of the present invention is due to the unique behaviors of Q1 and Q2 in saturations that occur at about 0V and 0.2V, respectively.

Figure 5:
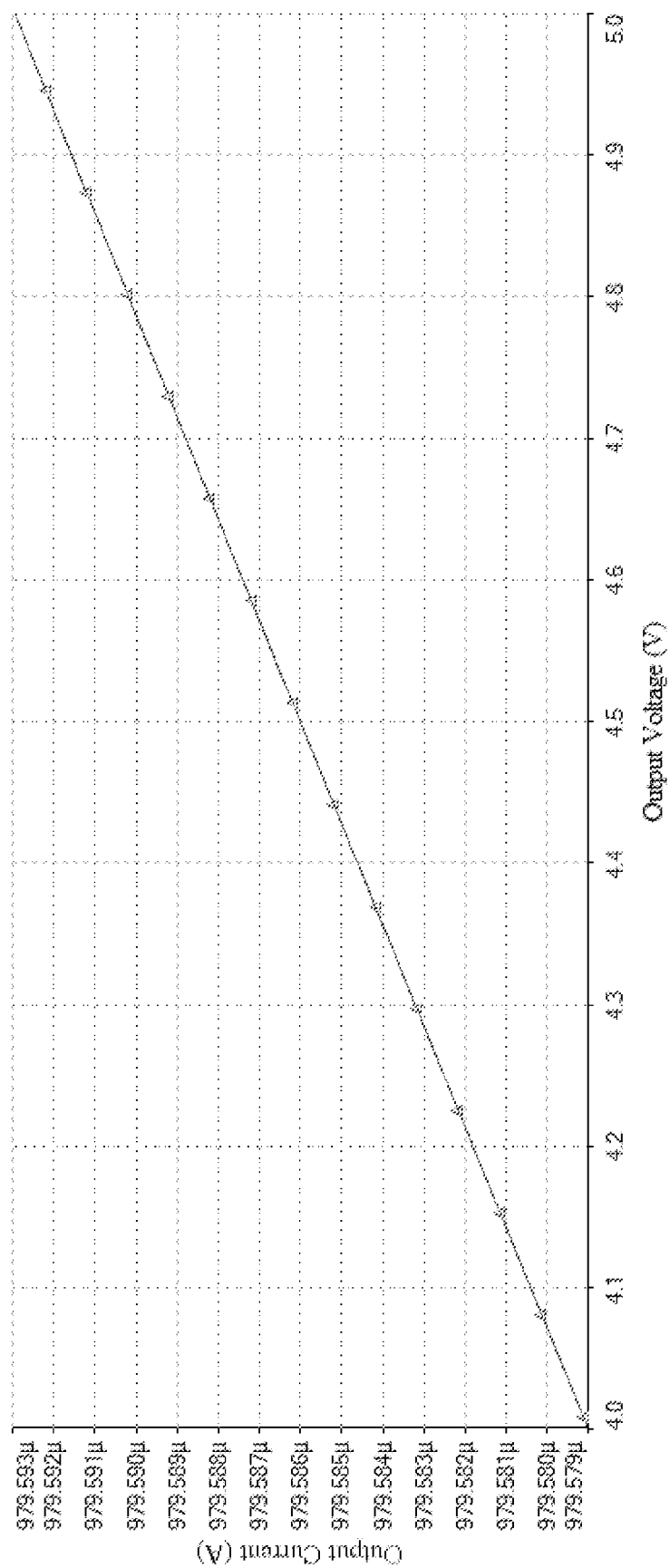
FIG. 5 is another graph illustrating the output current versus voltage (I-V) characteristics for determining the output resistance of a folded cascode current source in accordance with example implementations of the present disclosure.

The output resistance can be determined by examining the I-V characteristics for $V_o$ from 4V to 5V as shown by the graphs in FIG. 5. The plot shows that the output current varies from 979.5285 mA to 979.5440 mA over the 1V range. This corresponds to an output resistance of $R_{out} = 1V/14$ nA or about 71 MΩ. The simulation parameters for the BJTs are $\beta_n = 130$, $\beta_p = 180$, $V_A = 74V$. So $r_o$ is about 76 kΩ, yielding an output resistance of about 5 MΩ for the cascode or Wilson current source. According to the above theoretical results this value would increase by a factor of $\beta_n \| \beta_p = 130 \| 180$ or about 75 for the folded cascode such that the expected output resistance would be 75×5 MΩ=375 MΩ.

The discrepancy between the expected value of 375 MΩ and the simulated value of 71 MΩ can be taken into account the collector-based resistance $r_\mu$ that is typically $10\beta_n r_o$ or about 99 MΩ in this case. Thus, an estimate of the output resistance for the folded cascoded would be:

$$R_{out} \approx (\beta_n \| \beta_p)\frac{\beta_n r_o}{2} \| r_\mu$$

In other words, $R_{out} = 375$ MΩ $\| 99$ MΩ≈78 MΩ which is in the order of the simulation result of 71 MΩ.

Figure 6:
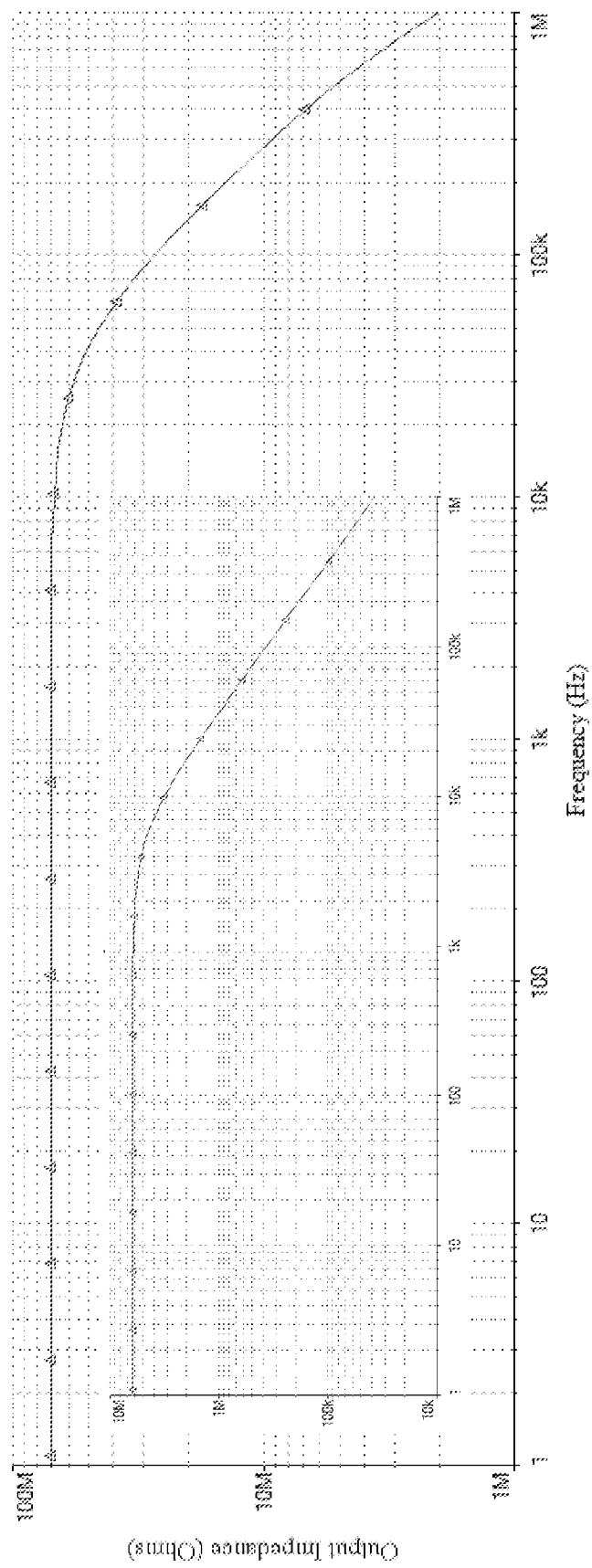
FIG. 6 is graph illustrating the frequency response of a folded cascode current source in accordance with example implementations of the present disclosure.

FIG. 6 graphs the frequency response of the output impedance of the folded cascode source. The plot shows a 3 dB bandwidth of about 40 kHz, corresponding to an impedance-bandwidth product of 71 MΩ×40 kHz=2.8 TΩ-Hz. The inset in FIG. 6 graphs the frequency response from Multisim for the cascode source of the prior art. The plot shows an output resistance of about 6.4 MΩ and a 3 dB bandwidth of about 7 kHz, corresponding to an impedance-bandwidth product of 44.8 GΩ-Hz, which is smaller by a factor of about 63 versus the folded cascode source.

The high output resistance of the folded cascode source is due to the current feedback from the dual pnp-npn mirrors configuration. An ideal analysis for the cascode source of the prior art in FIG. 1 would yield for Q1: $i_e = -i_b$ such that $i_o = i_e - i_b = -2 i_b$. A similar analysis with the dual mirrors of the folded cascode source of the present disclosure in FIG. 2 on the other hand would yield $i_e = i_b$ such that $i_o = i_e - i_b = 0$. In other words, any change in the output collector current would cause a change in the base current, which is then tracked exactly by the emitter current. The dual mirror configuration therefore would enable the base and emitter currents of the output BJT Q1 to balance out any change in the output collect current and keep it constant.

Unlike the cascode or Wilson source of the prior art, the output current of the folded cascode source is sensitive to $V_i$ because the collector-emitter voltages of Q2 and Q5 vary directly with $V_i$. Furthermore, the output voltage swing when both Q1 and Q2 are in active mode is $V_{MIN} = V_i - 2V_{BE} + V_{CE1,sat} = V_i - 1.2V$ when Q1 saturates. So, it is important that $V_i$ is not unnecessarily large.

Figure 7:
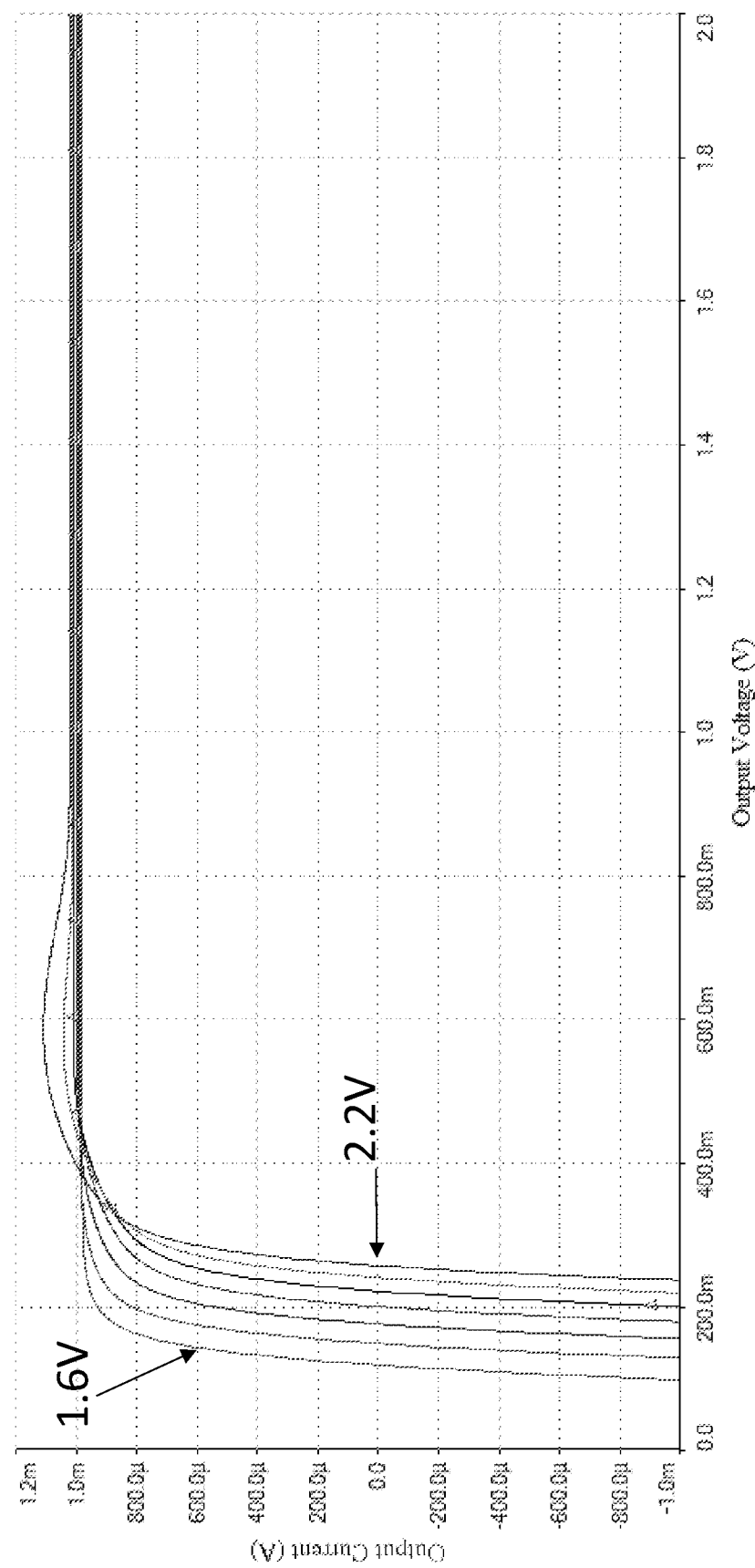
FIG. 7 is a graph illustrating the output current due to incremental change of the input voltage of a folded cascode current source in accordance with example implementations of the present disclosure.

The graphs in FIG. 7 show that the output current has increased, from 0.98 mA to nearly 1.02 mA, as $V_i$ varies from 1.6V to 2.2V in 0.1V increments. Notice that the current overshoots as Q1 first saturates, before dropping off when Q2 saturates at a lower output voltage.

Figure 8:
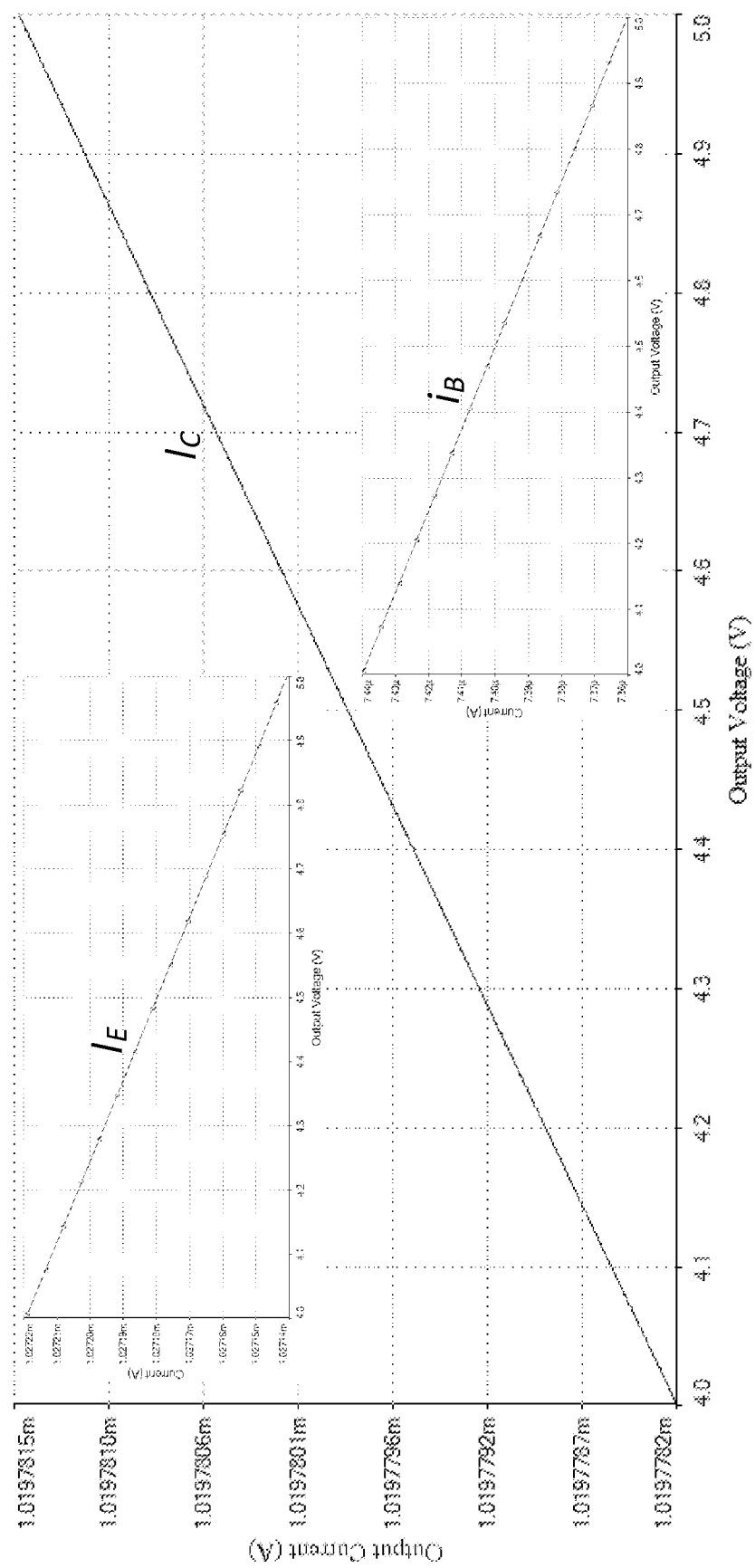
FIG. 8 is a graph illustrating the collector, base and emitter currents characteristics of a folded cascode current source in accordance with example implementations of the present disclosure.

The output resistance when $V_i = 2.2V$ can be determined by examining output current for $V_o$ from 4V to 5V as shown by the graphs in FIG. 8. The plot shows that the output current increased by about 3.3 nA over the 1V range. This corresponds to an output resistance of $R_{out} = 1V/3.3$ nA=303 MΩ. Since this value is much larger than the limit imposed by $r_o$, the folded cascode source that is overdriven with $V_i$ larger than 1.6V has the potential to achieve very high output resistance.

The lower and upper insets in FIG. 8 graph the base and emitter currents, respectively, over the same 4V to 5V output voltage range. The base current decreases from 7.44 μA to 7.36 μA or about 80 nA, and the emitter current has a similar 80 nA decrease as expected, from 1.02722 mA to 1.02714 mA.

Since Q1 would saturate before Q2, the current feedback action continues as long as Q2 remains in active mode, even though Q1 may be well into saturation as its collector-base junction is fully forward biased at $V_{BC1}=0.7V$ when $V_o=V_i-1.4V$. This can be observed from the results for $V_i=1.6V$ in FIG. 4, showing the apparent $V_{MIN} \sim 1.6V-1.4V=0.2V$, the saturation voltage of Q2 as Q1 is saturated at $V_{CE1} \sim 0V$.

The saturation behavior for $V_i>1.6V$ therefore is rather complicated, as evident by the current overshoots in FIG. 7 that would occur between the saturation voltage levels for Q1 and Q2, which are approximately $V_i-1.2V$ and 0.2V, respectively. Since the emitter of Q1 is approximately $V_i-1.4V$, Q1 would saturate as $V_o$ drops below $V_i-1.2V$. As $V_o$ drops further to $V_i-1.4V$ which corresponds to $V_{BC1}=0.7V$, the collector-base junction of Q1 becomes strongly forward biased causing the base current of Q1 to rise rapidly.

This current rise is tracked by the identical increase in the emitter current of Q1 via the dual mirror action as long as Q2 remains in active mode. With Q1 driven deep into saturation as $V_o$ continues to decrease below $V_i-1.4V$, $V_{CE1}$ would remain slightly just above 0V such that $V_{BE1}$ is slightly larger than $V_{BC1}=V_i-0.7-V_o>0.7V$. When $V_o$ drops to 0.2V, Q2 would saturate with $V_{CE1}=0V$ and $V_{CE2}=0.2V$. Then at $V_o=0V$, both BJTs would saturate with $V_{CE2}$ being just above 0V, and therefore $V_{CE1}$ just below 0V.

Figure 9:
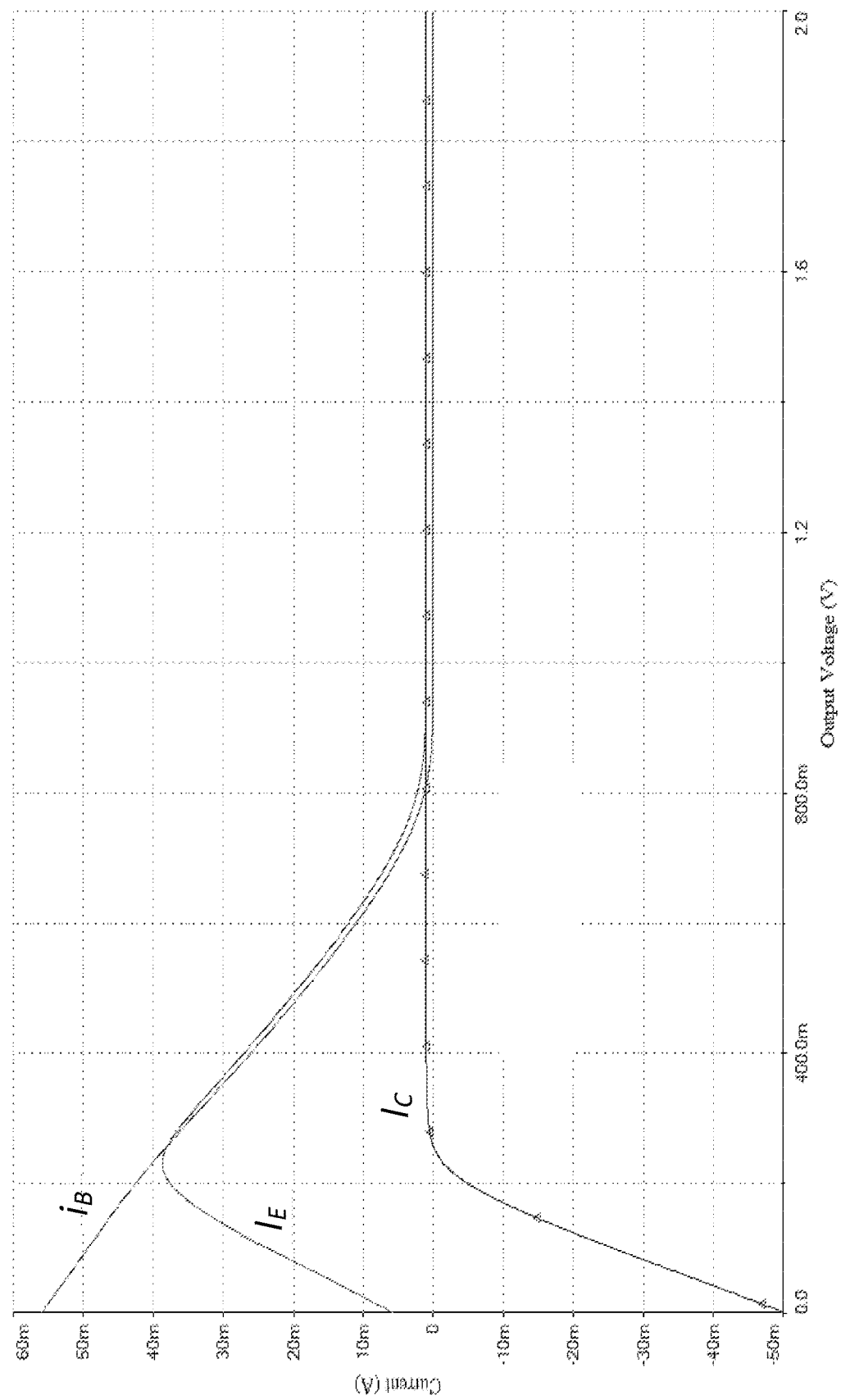
FIG. 9 is a graph illustrating the collector, base and emitter currents characteristics of a folded cascode current source in saturation in accordance with example implementations of the present disclosure.

FIG. 9 graphs the transistor currents of Q1 over the 0-2V output voltage range with $V_i=2.2V$, so that $V_{B1}=1.5V$ and the corresponding saturation voltage levels would be 1V and 0.2V. The plots show that $i_B$ rises significantly as $V_o$ drops below 0.8V, at which point Q1 is saturated with $V_{BC1}=0.7V$. It can be seen that $i_E$ would track slightly above $i_B$ so that $i_C$ remains relative constant. As Q2 begins to saturate near 0.2V, the npn mirror ceases to operate causing $i_E$ to no longer track $i_B$ and instead decrease rapidly as shown, resulting in the precipitous decline in $i_C$ as both BJTs saturate.

In FIG. 7, the output current overshoots as $V_o$ drops below $V_i-1.4V$ such that both E-B and C-B junctions of Q1 are forward biased with $V_{BE1}=V_i-0.7V-V_o+V_{CE,sat}$ and $V_{BC1}=V_i-0.7V-V_o$. Since the junction voltages grow increasingly larger than 0.7V as $V_o$ drops below $V_i-1.4V$, both $i_E$ and $i_B$ would rise exponentially with $V_{BE1}$ and $V_{BC1}$, respectively, with $i_E \sim i_B$ due to the dual mirrors but also rising at a faster rate than $i_B$ because $V_{BE1}>V_{BC1}$.

Consequently, the output collector current $i_C=i_E-i_B$ would also increase as $V_o$ drops further below $V_i-1.4V$ as shown in FIG. 7. Q2 saturates at about 0.2V causing $i_E$ to decrease rapidly and no longer track $i_B$ (which continues to rise from $V_{BC1}$) as can be seen in FIG. 9 for example, resulting in the precipitous decline in $i_C$. In summary, the current overshoot is the consequence of the collector current increasing due to Q1 being driven deeper into saturation and then declining eventually as Q2 saturates.

It should also be mentioned that since nominally $V_{CE2}=V_i-1.4V$, $V_{CE2}$ would increase with $V_i$. Hence the output current as well as the saturation voltage of Q2, $V_{CE2,sat}$, would also increase with $V_i$. This is evident in FIG. 7 where the curves for the output current would shift up in active mode and would shift to the right in saturation.

Notice that the overdriven folded cascode source ($V_i>1.6V$) would possess a negative incremental resistance in the saturation region where the current would overshoot as $V_o$ is reduced. Thus, since $R_{out}$ must transition from being negative in saturation to positive in active mode, this would also explain the increase of the output resistance in the active mode because the output current must enter a region of infinite incremental resistance where $di_o/dv_o=0$ Consequently, an overdriven folded cascode source can trade off a larger $V_{MIN} \sim V_i-1.4V$ in order to achieve a very high output resistance $R_{out}$ that is well beyond the limit imposed by $r_\mu$.

Figure 10:
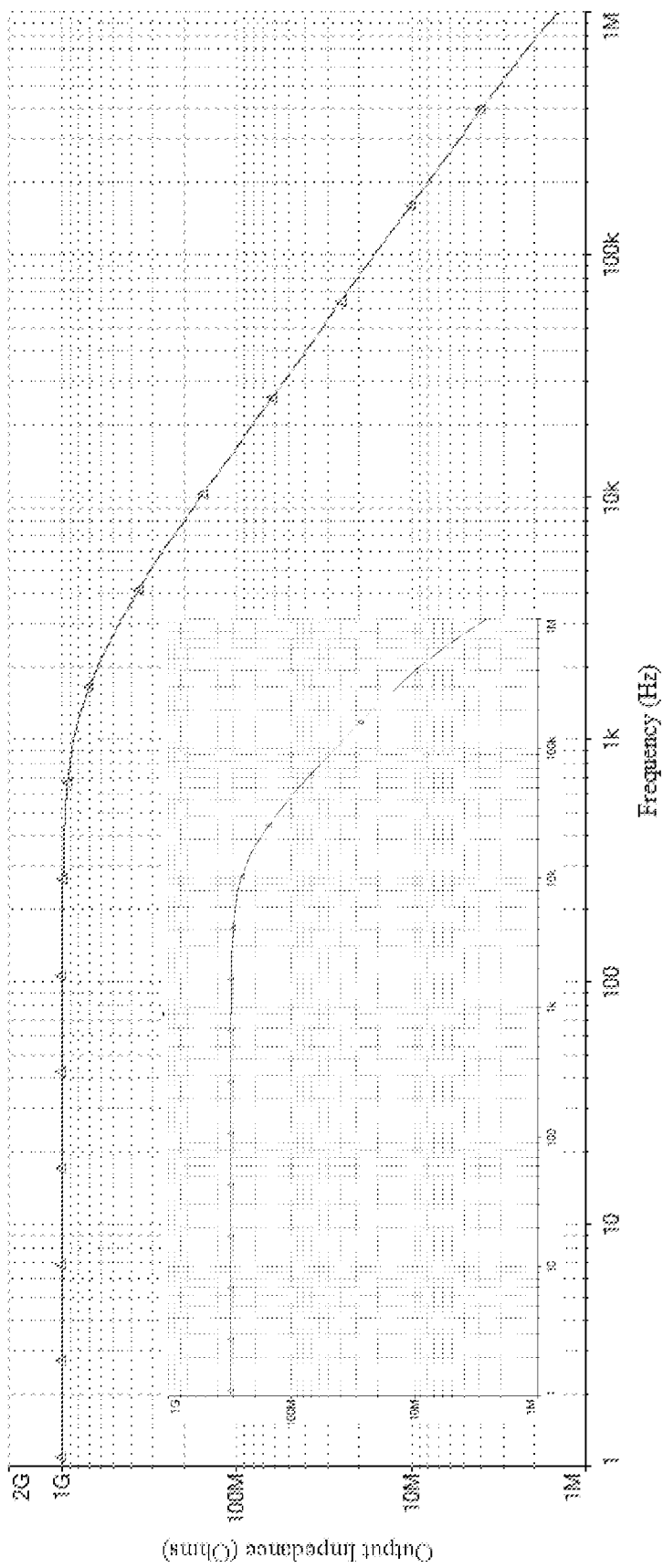
FIG. 10 is another graph illustrating the frequency response a folded cascode current source in in accordance with example implementations of the present disclosure.

FIG. 10 graphs the example Multisim output impedance response for $V_i=2.6V$ at 4.5V output voltage. The plot indicates an output resistance of about 1 GΩ and a 3 dB bandwidth of nearly 2 kHz, or an impedance-bandwidth product of nearly 2 TΩ-Hz. The inset depicts the frequency response for $V_i=2.2V$ that indicates a 3 dB bandwidth of nearly 20 kHz at about 300 MΩ as previously noted, or about 6 TΩ-Hz. Notice the single-pole response characteristics for 2.6V compared to the wide band response but faster roll-off at 2.2V.

Figure 11:
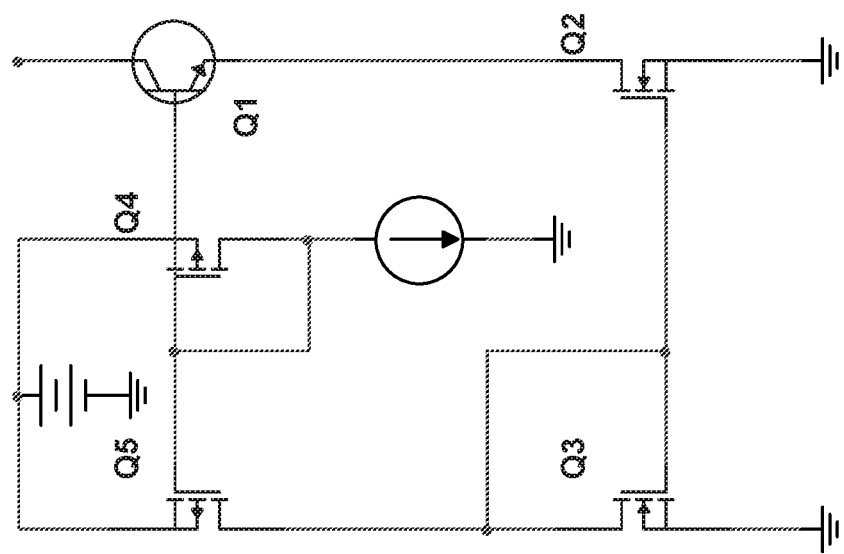
FIG. 11 is an electrical circuit diagram illustration of a folded cascode current source in accordance with an example implementation of the present disclosure using MOSFETs (metal-oxide-semiconductor field-effect transistors).

FIG. 11 shows the implementation of the present invention in MOSFETs (metal-oxide-semiconductor field-effect transistors). The dual mirrors consist of the nMOS pair Q2-Q3 and pMOS pair Q4-A5. The output transistor Q1 must be BJT for current sensing because the gate current would have been zero if Q1 was a MOSFET.

Figure 12:
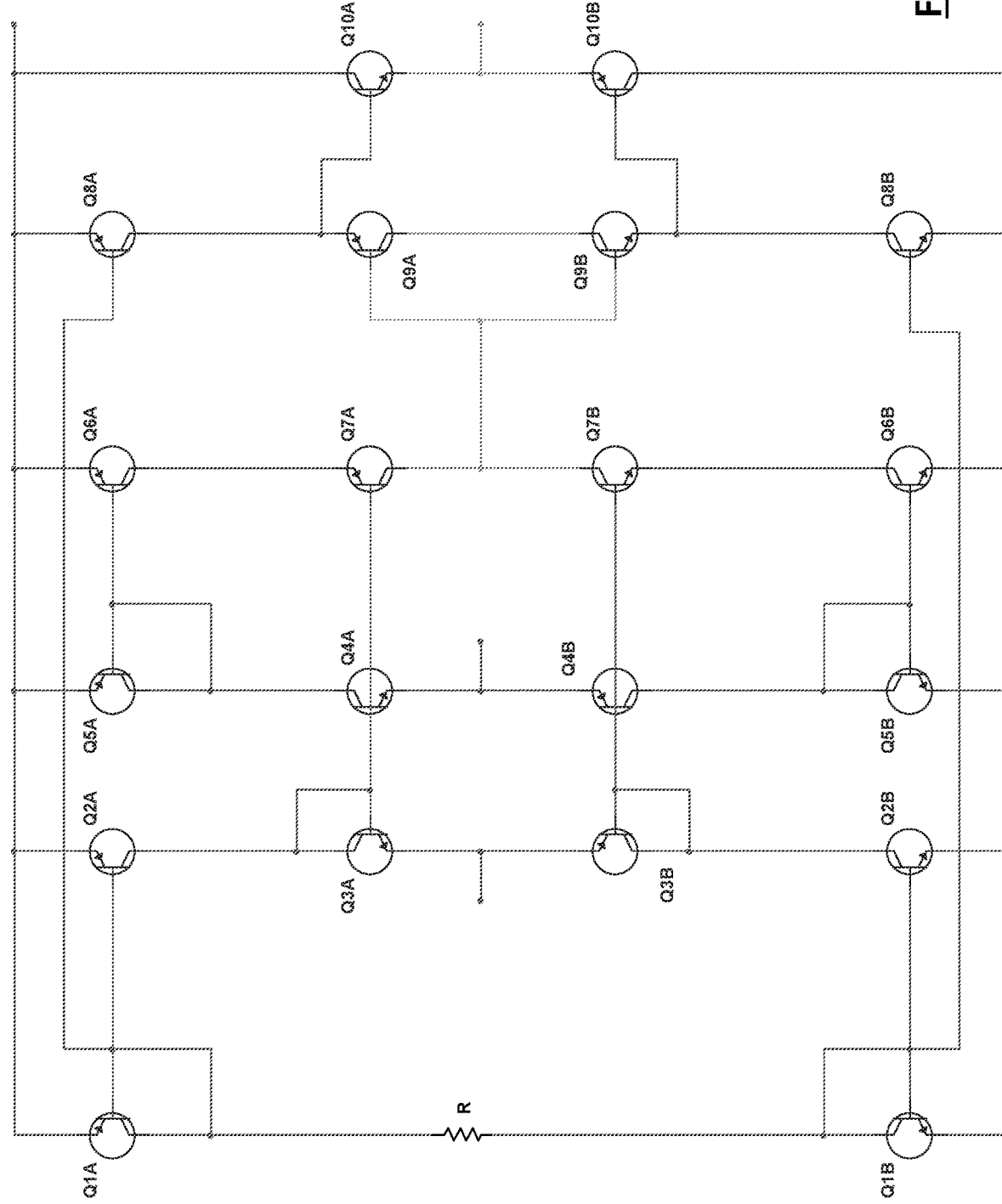
FIG. 12 is an electrical circuit diagram illustration of a current feedback amplifier that employ folded cascode current sources/sinks in accordance with example implementations of the present disclosure.

It is straightforward to design complementary current sources and sinks based on the folded cascode configuration. FIG. 12 illustrates an example electrical schematic for a current feedback amplifier using the folded cascode mirror design. Transistors Q1A-B and Q2A-B provide the reference currents while Q3A-B through Q7A-B form the complementary folded cascode source and sink for the current mode operation. The output stage consists of Q8A-B through Q10A-B. The design can be more efficient and high performance than using the conventional cascade or Wilson mirrors for the current mode operation.

Although the subject matter has been described in language specific to electrical features and/or process operations, it is to be understood that the subject matter defined in the appended claims is not necessarily limited to the specific features or acts described above. Rather, the specific features and acts described above are disclosed as example forms of implementing the claims.

What is claimed is:

1. A method for a folded cascode current source configuration achieving a high output resistance and comprising:
   first, second, third, fourth and fifth transistors, each having input, output and control terminals that correspond to the emitter, collector and base, respectively of bipolar junction type transistors (BJT), with the voltage between the control and input terminals controlling the output current; wherein said first transistor and said second transistor are in the cascode configuration so that the emitter of said first transistor is directly connected directly to the collector of said second transistor;
   current feedback circuitry including said third, fourth and fifth transistors that senses any change in the base current of said first transistor of said cascode configuration, and effects said change in the base current to be mirrored by an identical change in the emitter current of said first transistor so that its collector current remains substantially unchanged under the voltage variation from an external load at the collector of said first transistor of said cascode configuration.

2. The method of claim 1,
   wherein said second and third transistors pair and said fourth and fifth transistors pair form dual transistor current mirrors such that the collector current of said first transistor of said cascode configuration mirrors a reference current source; and
   wherein said dual mirrors effect any change in the base current of said first transistor of said cascode configuration to be mirrored by an identical change in the emitter current of said first transistor so that its collector current remains substantially unchanged under the voltage variation from an external load at the collector of said first transistor of said cascode configuration.

3. A device for a folded cascode current source achieving a high output resistance of a and comprising:
- first, second, third, fourth and fifth transistors, each having input, output and control terminals that correspond to the emitter, collector and base respectively of bipolar junction type transistors (BJT), with the voltage between the control and input terminals controlling the collector current, wherein said first transistor and said second transistor are in the cascode configuration so that the emitter of said first transistor is directly connected directly to the collector of said second transistor;
- current feedback circuitry including said third, fourth and fifth transistors that senses any change in the base current of said first transistor of said cascode configuration, and effects said change in the base current to be mirrored by an identical change in the emitter current of said first transistor so that its collector current remains substantially unchanged under the voltage variation from an external load at the collector of said first transistor of said cascode configuration.

4. The device of claim 3, wherein the transistors are BJTs.

5. The device of claim 3, wherein the transistors are MOSFETs.

6. A current feedback amplifier with differential input and output stages comprising the folded cascode current source and sink devices of claim 3.

7. The current feedback amplifier of claim 6, wherein the transistors comprising the folded cascode current source and sink devices are BJTs.

8. The current feedback amplifier of claim 6, wherein the transistors comprising the folded cascode current source and sink devices are MOSFETs.

9. The device of claim 3,
- wherein said second and third transistors pair and said fourth and fifth transistors pair form dual transistor current mirrors such that the collector current of said first transistor of said cascode configuration mirrors a reference current source; and
- wherein said dual mirrors effect any change in the base current of said first transistor of said cascode configuration to be mirrored by an identical change in the emitter current of said first transistor so that its collector current remains substantially unchanged under the voltage variation from an external load at the collector of said first transistor of said cascode configuration.

* * * * *